(12) United States Patent
Watanabe

(10) Patent No.: US 7,411,477 B2
(45) Date of Patent: Aug. 12, 2008

(54) INDUCTOR

(75) Inventor: Yoshito Watanabe, Tokyo (JP)

(73) Assignee: Sumida Corporation, Tokyo (JP)

( * ) Notice: Subject to any disclaimer, the term of this patent is extended or adjusted under 35 U.S.C. 154(b) by 0 days.

(21) Appl. No.: 11/628,169

(22) PCT Filed: May 23, 2005

(86) PCT No.: PCT/JP2005/009369

§ 371 (c)(1),
(2), (4) Date: Nov. 30, 2006

(87) PCT Pub. No.: WO2005/119709

PCT Pub. Date: Dec. 15, 2005

(65) Prior Publication Data

US 2007/0241850 A1    Oct. 18, 2007

(30) Foreign Application Priority Data

Jun. 4, 2004    (JP)    ............................ 2004-166597

(51) Int. Cl.
*H01F 27/29* (2006.01)
(52) U.S. Cl. .................................... 336/192
(58) Field of Classification Search ............... 336/65, 336/83, 192, 200, 232, 90
See application file for complete search history.

(56) References Cited

U.S. PATENT DOCUMENTS 3,590,329 A    6/1971    Krepps, Jr.
5,805,431 A *  9/1998    Joshi et al. .................. 361/836
2004/0135660 A1* 7/2004  Holdahl et al. ............... 336/90

FOREIGN PATENT DOCUMENTS

| DE | 2450513 | 4/1976 |
|---|---|---|
| DE | 102004031886 | 1/2006 |
| JP | 55-095310 | 7/1980 |
| JP | 05-315137 | 11/1993 |
| JP | 07-074036 | 3/1995 |
| JP | 08-264338 | 10/1996 |
| JP | 10-303036 | 11/1998 |
| JP | H10-303036 | 11/1998 |
| JP | 2001-085232 | 3/2001 |
| JP | 2001-85232 | 3/2001 |
| JP | 2003-017328 | 1/2003 |

* cited by examiner

*Primary Examiner*—Tuyen T. Nguyen
(74) *Attorney, Agent, or Firm*—Stephen Chin; von Simson & Chin, LLP

(57) ABSTRACT

An inductor using a rectangular wire wound in an axial direction roughly parallel with a mounted substrate, and enabling an increase in connection strength in mounting. The inductor (10) comprises a core member (20) formed of a magnetic material, the rectangular wire (30) formed in a flat shape so that the contact faces thereof are positioned along the longitudinal direction and forming winding structures (31) by winding them on the outer peripheral surface of the core member (20) by edgewise winding, and a case body (40) in which the core member (20) and the rectangular wire (30) are disposed. The rectangular wire (30) is wound, by multiple turns, on the core member (20), and the multiple winding structures (31) are disposed, in a stacked state, along the axial direction of the core member (20).

14 Claims, 7 Drawing Sheets

INDUCTOR

CROSS-REFERENCES TO RELATED APPLICATIONS

This application claims priority to International Application No. PCT/JP2005/009369 filed May 23, 2005, which claims priority to Japanese Application No. 2004-166597 filed Jun. 4, 2004, the entire disclosures of which are hereby incorporated by reference.

TECHNICAL FIELD

The present invention relates to an inductor for use in a variety of devices mounted on a vehicle.

BACKGROUND OF THE INVENTION

A variety of devices mounted on a vehicle include an inductor and as such an inductor mounted on a vehicle, there has been known a type in which coil is wound around a core and the core and coil are covered with a casing or the like as required while the terminal of the wire is installed by flow solder or the like. The inductors include a laterally mounted type inductor which is mounted with the axial line of the winding parallel to a mounting substrate. The laterally mounted type inductor has an advantage that the dimension of its projection can be reduced when the length of the coil in the axial direction is large.

In recent years, there exists an inductor of a type using flat wire as coil to increase the percentage of occupation of the inductor and meet a trend of intensified current. As an example, Patent Document 1 has disclosed an inductor of the aforementioned laterally mounted type in which two flat wires are wound by edgewise winding such that the flat wires overlap. Further, Patent Document 2 has disclosed a structure in which two flat wires wound in edgewise winding are stacked along the normal line direction of a mounting substrate.

Patent Document 1: Japanese Patent Application Laid-Open No. 2003-17328 (see summary, paragraph number 0012, FIG. 1 and the like)

Patent Document 2: Japanese Patent Application Laid-Open No. 2001-85232 (see summary, FIG. 1 and the like)

DISCLOSURE OF THE INVENTION

Problem to be Solved by the Invention

If the size of the inductor is increased due to intensified thickness of the flat wire, increased number of windings or the like in a type using the flat wire of the inductor, the laterally mounted type inductor is sometimes used considering the strength of attachment to the substrate. Particularly, in the inductor for use in a variety of device mounted on a vehicle, the strength of attachment needs to be higher considering that vibration is applied.

In the laterally mounted type inductor using the flat wire disclosed in the Patent Document 1, the terminals of adjoining flat wires abut on each other because two flat wires are wound in an overlapping state. Thus, their mounting positions on the substrate are located close to each other so that solder comes to a adjoining position upon soldering operation thereby leading to faults such as short-circuit. If the terminals are located close to each other at each end of the winding along the axial line so that their attachment positions are close, this inductor is weak to vibration parallel to the substrate and perpendicular to the axial direction although it is highly resistant to vibration along the axial direction. For this reason, the inductor is unfavorable in terms of reliability under the environment in which vibrations are applied from various directions, like the device mounted on a vehicle.

In the meantime, the inductor disclosed in the Patent Document 2 has a fear from viewpoints of strength as the device mounted on a vehicle because it is longitudinally mounted type, if the length of projection in the axial direction of the winding is large. In addition, the flat wires need to be bent twice at each terminal, so that its manufacture costs more by a corresponding amount than the laterally mounted type.

The present invention has been achieved in views of the above-described circumstances. An object of the invention is to provide an inductor using the flat wires in which the axial direction of the winding is substantially parallel to amounting substrate, the inductor enabling improvement of strength of attachment upon mounting.

Means for Solving the Problem

To solve the above-described problem, the present invention comprises a core member composed of magnetic material, flat wires whose contact faces are in a flat shape along the longitudinal direction and formed into a winding structure when wound around the outer peripheral face of the core member by edgewise winding, and a case body having a concave portion in which the winding structure and the core member are located by built-in while the axial line of the core member opposes the bottom face of the concave portion, wherein the flat wires are wound around the core member by plural turns and the plural winding structures are overlapped along the axial direction of the core member.

With this structure, the core member and the flat wires are embedded in the concave portion, so that the winding structure is located in the concave portion. At this time, the axial line of the core member opposes the bottom face of the concave portion, so that the axial direction of the winding is substantially parallel to the opening portion in the case body and the core member and the flat wires are placed in the concave portion of the case body. For this reason, when the inductor is mounted on a substrate, it is mounted laterally. Plural winding structures are overlapped along the axial direction on the outer peripheral face of the core member by winding of the flat wires. Thus, the number of the terminals of the flat wires can be increased. Consequently, when the inductor is mounted on the substrate, the area of the attachment portions can be increased by an amount corresponding to the increase of the terminals and as a result, the inductor can be attached firmly.

By increasing the number of the terminals so as to intensify the attachment strength of the inductor, reliability of each device using the inductor can be maintained for a long period. Thus, even if the inductor is used under an environment in which vibration is applied such as devices mounted on a vehicle, reliability can be maintained so as to operate those devices for a long period.

According to another invention, the case body includes slits each directed from the side of an opening portion constituting the case body to a side departing from the opening portion side and at least one of the terminals of the flat wires is provided with an expanded portion which is expanded outward of the winding by expanding the diameter while the expanded portions are inserted into the slits.

With this structure, the expanded portion is inserted into the slit, so that the expanded portion can be visually recognized from outside. Thus, when part of the expanded portion is attached by soldering or the like, the attachment portion can be visually recognized from outside easily. Because the attachment condition can be verified with the eyes, reliability in attachment of the inductor can be intensified. If separation or the like occurs in the attachment portion of the inductor, it can be confirmed with the eyes.

According to still another invention, the expanded portion exists on only a side of the terminal adjoining the other flat wire.

With this structure, the expanded portion is provided on only a terminal existing on a side adjoining the other flat wire. Thus, the expanded portion can be visually recognized more easily from outside because it is expanded outward. Consequently, the attachment condition of the terminal having the expanded portion can be visually recognized more easily from outside thereby intensifying reliability in mounting of the inductor.

According to a further invention, two flat wires are provided. In such a structure, the two flat wires have each expanded portion and there are provided a terminal opposing the other flat wire and a terminal having no expanded portion and not adjoining the flat wire (located at an end portion). Thus, the terminal having the expanded portion and the terminal having no expanded portion are shifted from each other and not overlapped when the inductor is seen in a condition in which the axial line comes to its front face. As a result, the attachment condition of the terminal can be visually recognized only by seeing the inductor from its front side.

According to a yet further invention, the case body is provided with a bottom end concave portion which is dented from the edge portion of the opening portion in the side face and a substrate attachment portion constituted by bending the terminal of the flat wire is located in the bottom end concave portion.

With such a structure, the substrate attachment portion is located in the bottom end concave portion. Thus, interference between the side face constituting the case body and the substrate attachment portion can be prevented. By providing the substrate attachment portion, area in which the terminal is to be attached to the substrate can be secured corresponding to the size of the bottom end concave portion, thereby securing the attachment strength between the substrate and the inductor.

According to a yet further invention, the terminals existing on sides adjoining the other flat wire of the plural flat wires are connected to each other through a mounted substrate.

With such a structure, the area of mounting positions of the flat wires to the substrate can be increased corresponding to the number of the flat wires. As a consequence, the attachment strength of the attachment position can be increased thereby improving reliability of the inductor. Further, plural winding structures constituted of plural flat wires can be regarded as an inductor constituted of a single flat wire.

Effect of the Invention

In the inductor using the flat wire and in which the axial line of the winding is substantially parallel to a mounted substrate, the attachment strength in mounting can be improved.

DESCRIPTION OF REFERENCE NUMERALS

Figure 1:
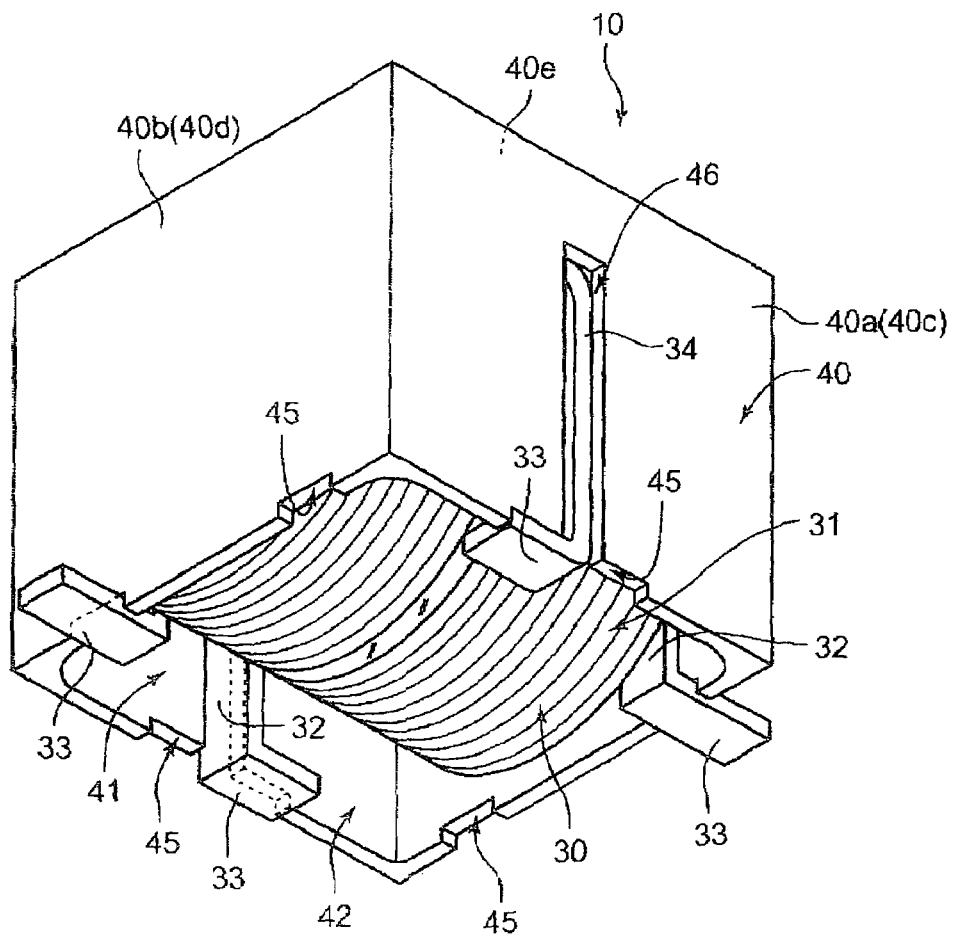
FIG. 1 is a perspective view showing the appearance of an inductor according to a first embodiment of the present invention.

10, 11: inductor
20, 200: core (corresponding to core member)
30: flat wire
31: winding structure
31*a*: through hole
32: terminal
33: substrate attachment portion
34: expanded portion
40: case body
40*a*-40*d*: side face
40*e*: top end face
41: concave portion
42: opening portion
43: positioning concave portion
44: core receiving portion
45, 450: bottom end concave portion
46: slit
202: jaw portion

BEST MODE FOR CARRYING OUT THE INVENTION

First Embodiment

Figure 8:
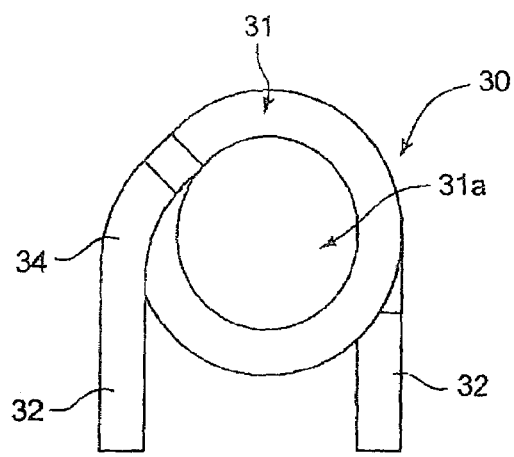
FIG. 8 is a front view showing a winding state of flat wire for use in the inductor of FIG. 1.
Figure 9:
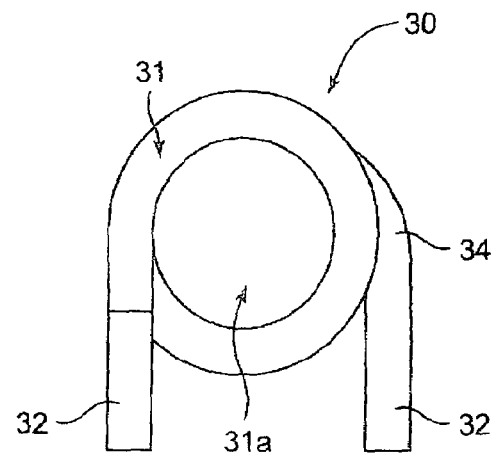
FIG. 9 is a rear view showing the winding state of flat wire for use in the inductor of FIG. 1.
Figure 10:
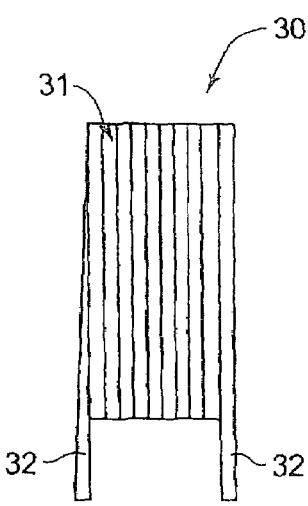
FIG. 10 is a side view showing the winding state of flat wire for use in the inductor of FIG. 1.

Hereinafter, the inductor of the first embodiment of the present invention will be described with reference to FIGS. 1-10. FIG. 1 is a perspective view showing the entire structure of the inductor 10 according to the first embodiment of the present invention. FIGS. 2-7 are diagrams showing the states of the inductor 10 as seen from respective directions, and FIGS. 8-10 are diagrams showing the state of the flat wire 30 in a winding state as seen from respective directions.

In the description below, the upper side designates an opposite direction to the advancement direction of a terminal 32 of the flat wires 30, which is perpendicular to the axial line L (see FIGS. 3-6) of the inductor 10 and the lower side designates the advancement direction of the terminal 32 of the flat wires 30 which is perpendicular to the axial line L of the inductor 10. The one end side designates the side of a side face 40*b* along the direction of the axial line L and the other end side designates the side of a side face 40d along the direction of the axial line L.

The inductor 10 is a laterally mounted type inductor in which the coil is mounted such that the axial line L is parallel to the surface of a substrate (not shown). This inductor 10 has a core 20, flat wires 30 and case body 40.

Figure 2:
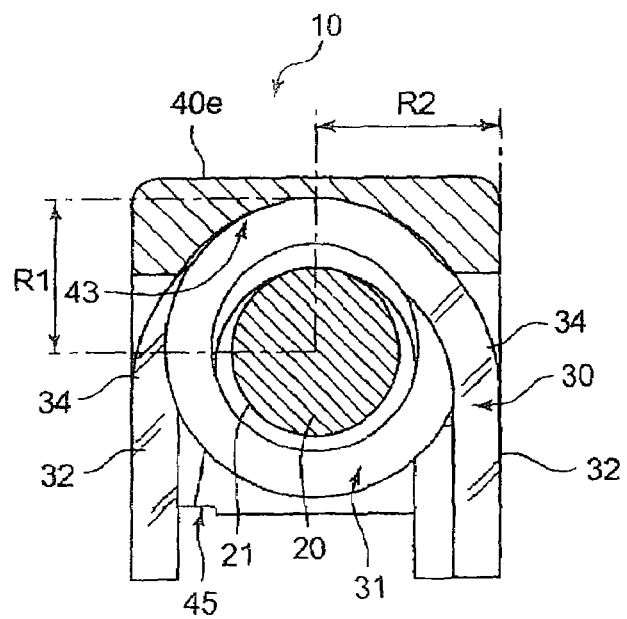
FIG. 2 is a front sectional view of the inductor of FIG. 1 as seen along the axial direction of the inductor.
Figure 5:
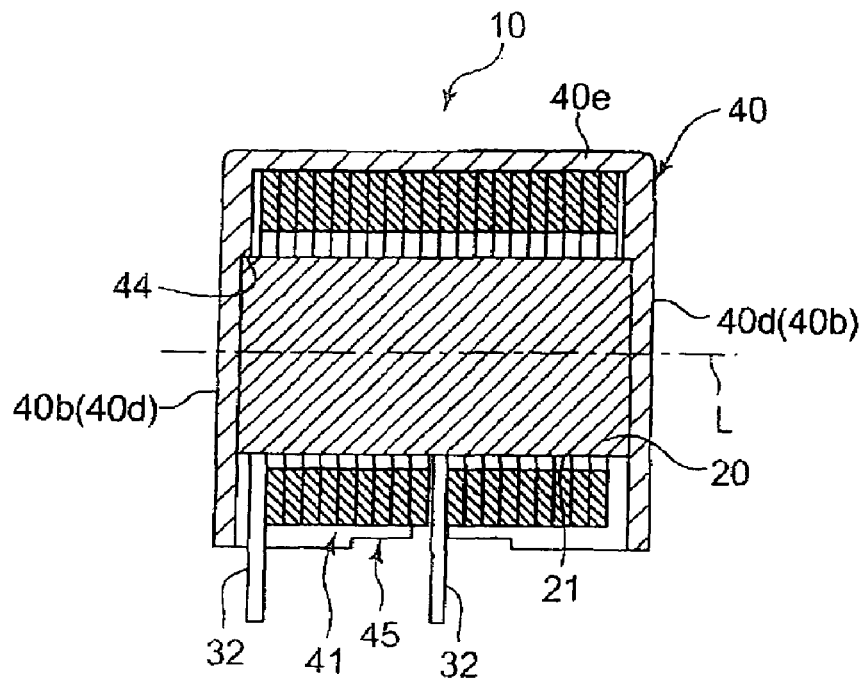
FIG. 5 is a side sectional view of the inductor of FIG. 1 as seen from the side of the inductor.
Figure 6:
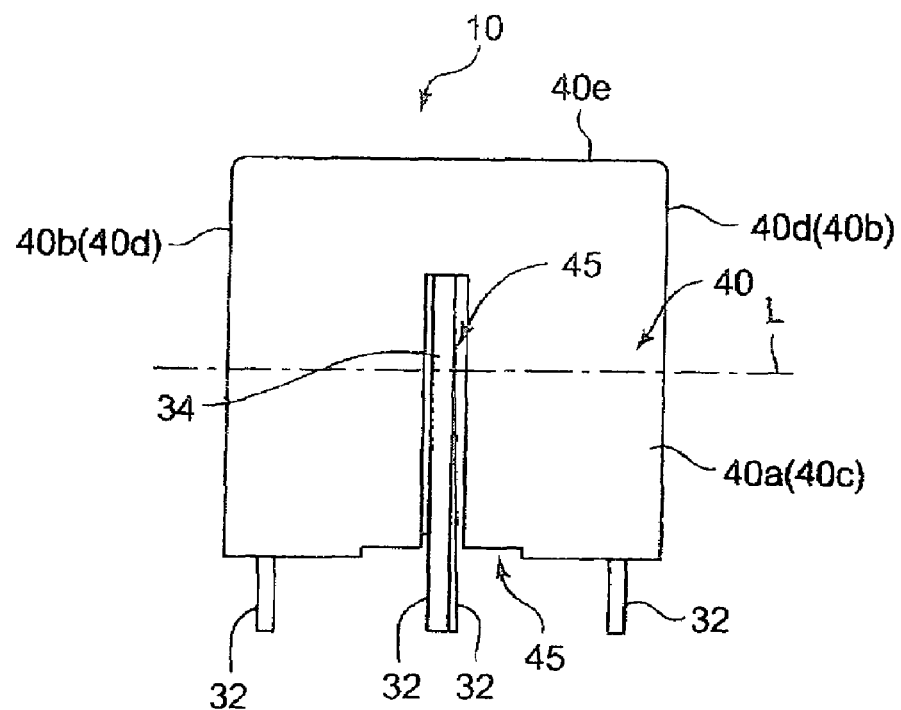
FIG. 6 is a side view of the inductor of FIG. 1 as seen from its side.
Figure 7:
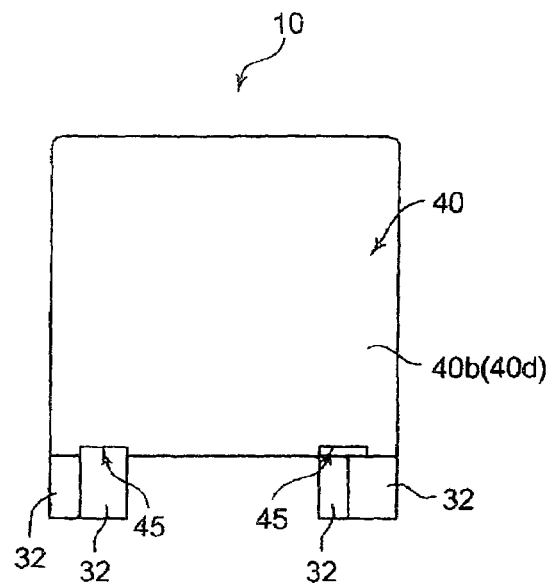
FIG. 7 is a front view of the inductor of FIG. 1 as seen from the front face.

As shown in FIGS. 1, 2 and 5, the core 20 as a core member is a member which presents a cylindrical appearance. Flat wires 30 described later are wound on the outer peripheral face 21 (see FIGS. 2 and 5). The core 20 is composed of magnetic material such as nickel base ferrite core. However, the material of the core 20 is not restricted to ferrite core but may be permalloy or other magnetic materials. The core 20 is positioned in a concave portion 41 of a case body 40 described later in conditions in which the flat wires 30 are wound therearound. The core 20 has a length suitable for being embedded in the concave portion 41 described later. The axial line (coincident with the axial line L of the inductor 10) of the core 20 opposes the bottom face of the concave portion 41 such that it is parallel thereto when the core 20 is embedded in the concave portion 41 described later.

Figure 3:
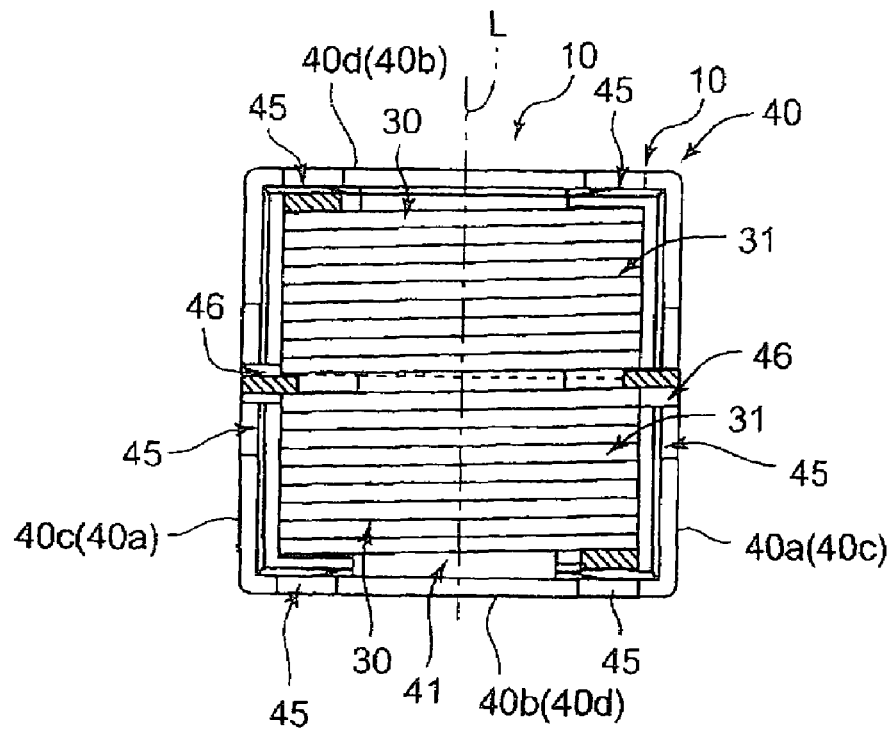
FIG. 3 is a bottom view of the inductor of FIG. 1 as seen from the side of an opening portion of the inductor.
Figure 4:
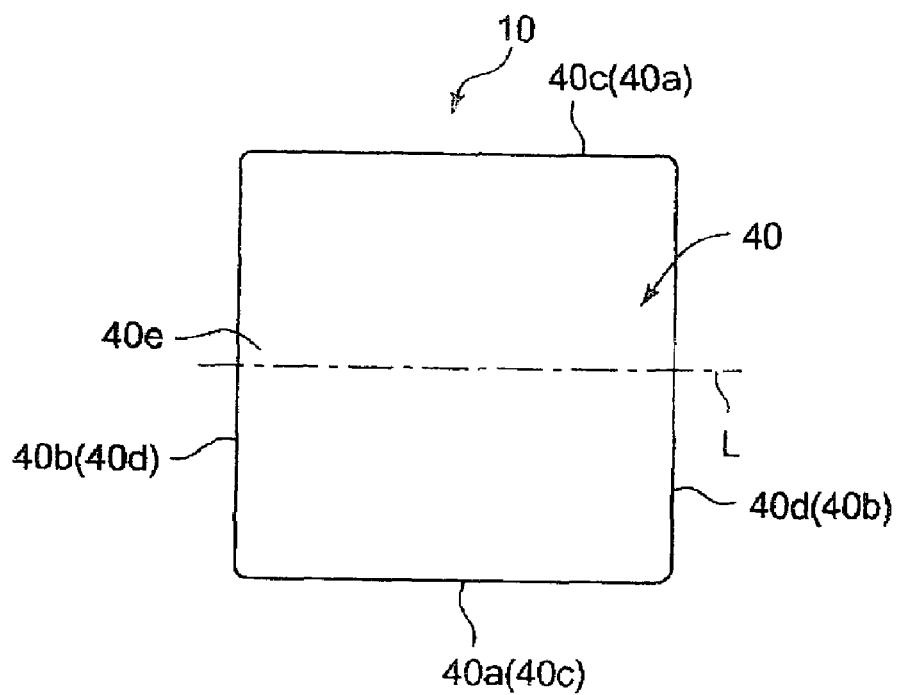
FIG. 4 is a plan view of the inductor of FIG. 1 as seen from above.

As shown in FIGS. 3 and 5, this embodiment uses two flat wires 30. As shown in FIGS. 8-10, the flat wire 30 is divided to winding structure 31, terminal 32 and substrate attachment portion 33 (see FIG. 1; FIG. 2 indicates a state before the substrate attachment portion 33 is formed) depending on a difference of the position. The flat wire 30 has a flat-shaped section and its outer peripheral face is coated with insulating film such as enamel. The flat wire 30 is wound by edgewise winding. A through hole 31a (see FIGS. 8, 9) is formed in the winding structure 31 produced by winding the flat wire 30 by such edgewise winding and the aforementioned core 20 is inserted into the through hole 31a.

According to this embodiment, as shown in FIGS. 2, 8 and 9, at least one of the terminals 32 of the flat wire 30 is bent in diameter expansion direction. If as shown in FIG. 2, a distance (radius) from the center of the winding structure 31 to the outer peripheral face of the flat wire 30 is R1 and a distance from the center of the winding structure 31 to the terminal 32 of the expanded flat wire 30 is R2, a relationship of R1<R2 exists. In the meantime, in the description below, a portion expanded outward by diameter expansion is called expanded portion 34. Two terminals 32 extending from the winding structure 31 are parallel to each other, extending to the side of an opening portion 42.

The flat wire 30 shown in FIGS. 8-10 has a sectional area substantially half that of the flat wire 30 used conventionally. According to this embodiment, the sectional area of the flat wire 30 is reduced to substantially half by reducing the width to substantially half and the thickness of the flat wire 30 is equal to the flat wire 30 conventionally used. However, the sectional area of the flat wire 30 may be reduced to substantially half by reducing the thickness of the flat wire 30 to substantially half and in this case, the width of the flat wire 30 is equal to the conventional wire. The width or the thickness of the flat wire 30 is not restricted to the case in which it is half but may be more than half the width or thickness of the flat wire 30.

If the width of the flat wire 30 is reduced to substantially half, the diameter of the core 20 may be set larger corresponding thereto.

Of the terminal 32 of the flat wire 30, as shown in FIG. 1, a portion projecting from the concave portion 41 of the case body 40 described later serves as a bent substrate attachment portion 33. The substrate attachment portion 33 is attached to a mounting position of a substrate (not shown) by, for example, soldering or the like. However, the attachment method of the substrate attachment portion 33 to the mounting position is not restricted to soldering but may be laser beam welding, arc welding or other attachment methods.

As shown in FIGS. 1-7, the case body 40 is formed of nonmagnetic material such as resin. The case body 40 is constructed in a box-like shape such that it is surrounded by plural side faces 40a-40d and the top end face 40e. The concave portion 41 is provided (see FIGS. 3, 5) within the case body 40 as a result of being surrounded by the side faces 40a-40d and the top end face 40e while the one end side (bottom end side) of the box is open as the opening portion 42.

A positioning concave portion 43 is provided on the side of the top end face 40e within the concave portion 41 as shown in FIG. 2. The positioning concave portion 43 is a dented portion having a circular section for positioning the outer peripheral face of the winding structure 31. Thus, the positioning concave portion 43 is provided in a shape meeting the circle of the outer peripheral face of the winding structure 31.

A core receiving portion 44 is provided within the concave portion 41. The core receiving portion 44 is a stepped portion, and the core 20 is received by the stepped core receiving portion 44. The core receiving portion 44 is formed by thinning the side faces 40b and 40d toward the top end face 40e from the opening portion 42 and stopping the thinning of the thickness at a position apart from the top end face 40e by a predetermined distance. Thus, the core receiving portion 44 is located at a position apart from the top end face 40e by a predetermined distance. When the core 20 is received by the core receiving portion 44, the core 20 is positioned in the concave portion 41 so that the axial line L is determined.

As shown in FIGS. 1-3 and 5-7, the case body 40 is provided with a bottom end concave portion 45 in the bottom end of the side faces 40a-40d. The bottom end concave portion 45 is dented by a predetermined size from the bottom end of the side faces 40a-40d toward upward in order to prevent the substrate attachment portion 33 of the flat wire 30 from interfering with the side faces 40a-40d of the case body 40. Of the bottom end concave portions 45, the substrate attachment portion 33 extends outward of the concave portion 41 from the bottom end portions 45 located at the side faces 40b and 40d.

The dimension of the dent is set to such a dimension that when the substrate attachment portion 33 of the flat wire 30 is located at the bottom end concave portion 45, the bottom face of the substrate attachment portion 33 just projects downward from the bottom end of the side faces 40a-40d of the case body 40. Then, the inductor can be mounted easily by soldering the substrate attachment portion 33 to the substrate. Of the bottom end concave portions 45, the bottom end concave portions 45 existing in the side faces 40a and 40c parallel to the axial line L are wider than the bottom end concave portions 45 existing in the side faces 40b and 40c. The reason is that the bottom end concave portions 45 existing in the side faces 40a and 40c are in a continuous state across a slit 46.

The side faces 40a and 40c parallel to the axial line L of the case body 40 are provided with the slit 46. Each slit 46 is formed to be directed upward from the bottom end concave portion 45 and the top end side of the slit 46 is spaced from the top end face 40e by a predetermined dimension. The terminal 32 located in the central portion of the axial line L of the terminals 32 of the flat wire 30 is inserted into the slit 46. In this case, the terminals 32 are kept into the slits 46 in an inserted state such that either each of them is flush with the side faces 40a and 40c or each of them projects outward from the side faces 40a and 40c.

In the inductor 10 described above, two flat wires 30 are wound around the outer peripheral face of the core 20 by using a winding machine or the like so as to form two winding structures 31. Further, of the terminals 32 of the flat wires 30, the terminal 32 located on the side of the center of the axial line L is bent to be directed to the diameter expansion direction so as to form the expanded portion 34. In this case, the radius of the winding structure 31, which is a radius R1 before the diameter is expanded, turns to a radius R2 after the diameter is expanded. The expanded portion 34 after the diameter expansion is processed to be parallel to the other terminal 32.

After the flat wires 30 are wound completely with the two winding structures 31 formed, the core 20 and the flat wires 30 are embedded into the concave portion 41. In this case, the side of the terminal 32 of the flat wire 30 is positioned on the side of the opening portion 42 of the concave portion 41. Then, the outer peripheral face of the winding structure 31 is positioned by the positioning concave portion 43 so that the core 20 is positioned by the core receiving portion 44. At the same time, the terminals 32 on the side of the center are inserted into the slits 46, so that the outer peripheral face of the terminal 32 becomes flush with the side faces 40a and 40c or the outer peripheral face of the terminal 32 projects from the side faces 40a and 40c.

Before or after the core 20 and the flat wires 30 are inserted into the case body 40, the terminal 32 of the flat wire 30 is bent. In this case, the substrate attachment portion 33 is inserted into the bottom end concave portion 45 in the side faces 40b and 40d and then, the substrate attachment portion 33 is bent so that it projects in a direction of departing from the bottom end concave portion 45. In the side faces 40a and 40c, the terminal 32 is bent so that it is parallel to the axial line L and the substrate attachment portion 33 is inserted into the bottom end concave portion 45. Thus, the substrate attachment portion 33 is extended parallel to the side faces 40a and 40c without departing from the side faces 40a and 40c.

According to this embodiment, the two substrate attachment portions 33 are bent to be directed to the side face 40b or side face 40d at the same time so that they are extended in the same direction.

After such bending, each substrate attachment portion 33 is soldered to the mounting position of the substrate. For example, the soldering is performed by dipping the substrate attachment portions 33 into a soldering bath and then bringing the substrate attachment portions 33 into contact with the mounting positions of the substrate. In this case, the substrate attachment portions 33 on the side of the center of each of the two flat wires 30 are mounted to positions conductive with a circuit pattern which connects the two substrate attachment portions 33. As a consequence, the two substrate attachment portions 33 are connected to each other.

After the attachment by soldering or the like is completed, the inductor 10 is mounted onto the substrate.

In the inductor 10 having such a structure, the core 20 and the flat wires 30 exist in the case body 40 with the outer peripheral face of the winding structure 31 kept in contact therewith. Thus, the axial lien L of the winding is substantially parallel to the opening portion 42 of the case body 40 and the inductor 10 is mounted laterally. The two winding structures 31 are overlapped on the outer peripheral face of the core 20 along the axial line L. Thus, the number of the terminals 32 of the flat wires 30 can be increased and when the inductor 10 is mounted on the substrate, the area of the attachment portions can be increased just by the same amount as the increase of the terminals 32. Consequently, the inductor 10 can be attached to the substrate firmly.

By increasing the number of the terminals 32 to intensify the attachment strength of the inductor 10, reliability of each device using this inductor 10 can be maintained for a long period. Thus, even if the inductor 10 is used under an environment in which vibration is applied like each device mounted on a vehicle, reliability can be maintained to operate the device for a long period.

In the laterally-mounted type inductor in which winding operation is executed with two flat wires overlapped as mentioned in the Patent Document 1, such a fault as terminals of the flat wires being close to each other can be prevented. Thus, a fault of the terminals being short-circuited because they are placed close to each other can be blocked. Particularly, because in the inductor 10 of this embodiment, a distance of the attachment portions to the substrate can be set larger by keeping the terminals 32 apart from each other, generation of a short-circuit can be blocked when the inductor 10 is mounted to the substrate by soldering or the like. Further, adopting the structure in which the substrate attachment portions 33 are apart from each other facilitates a work of attaching the substrate attachment portions 33 to the substrate thereby achieving excellent work efficiency.

Further, because the distance between the respective substrate attachment portions 33 (terminals 32) can be increased, this inductor is more resistant to a vibration parallel to the substrate and perpendicular to the axial line L than the inductor mentioned in the Patent Document 1. Thus, drop of reliability can be blocked under an environment in which vibrations are applied from various directions as devices mounted on a vehicle.

Although in the conventional longitudinally mounted type inductor, the number of bendings at each terminal of the flat wire requires twice, the substrate attachment portion 33 is formed by bending the terminal 32 only once in the inductor 10 of this embodiment. Thus, manufacturing cost can be reduced as compared to the longitudinally mounted type inductor.

This embodiment has an advantage that the value of the inductance can be increased by increasing the diameter of the core 20 if the width of the flat wire 30 is substantially half. Conversely, if the thickness of the flat wire 30 is set substantially half, processing of the flat wire 30 is facilitated. Particularly if the thickness thereof is substantially half, automatically winding of the aforementioned flat wire 30 using a winding machine is facilitated, so that the winding operation with the winding machine is made easier than a case of winding a thick round wire like conventionally.

The case body 40 has the slit 46, and the flat wire 30 has the expanded portion 34 which is expanded in the diameter direction of the winding at one of the terminals 32, and the expanded portion 34 is inserted into the slit 46. Thus, the expanded portion 34 can be recognized visually from outside. As a result, when the substrate attachment portion 33 is attached by soldering or the like, an attachment portion between the substrate attachment portion 33 and the substrate can be visually recognized easily from outside. Reliability of attachment of the inductor 10 can be intensified by recognizing the attachment condition visually. Even if peeling or the like occurs at the attachment position of the inductor 10, the peeling can be visually recognized thereby making it easy to find out the reason for the fault.

In the meantime, the expanded portion 34 is provided on the terminal 32 existing on a side adjoining the other flat ware 30 while no expanded portion 34 is provided at the terminal 32 existing on a side not adjoining the other flat wire 30. In addition, according to this embodiment, only two flat wires 30 are used. Thus, when the inductor 10 is seen in a condition in which the axial line L comes to the front face (the side faces 40b and 40d come to the front face), they do not overlap each other because the positions of the terminals 32 shift from each other (see FIG. 7). Consequently, the attachment state between the substrate attachment portion 33 and the substrate is easier to recognize visually thereby intensifying reliability of the inductor 10.

Further, the case body 40 is provided with the bottom end concave portion 45 which is a dent in each of the side faces 40a-40d from the edge portion of the opening portion 42, and the substrate attachment portion 33 is located at the bottom end concave portion 45. Thus, an area in which the substrate 32 is to be attached to the substrate can be secured correspondingly to the size of the bottom end concave portion 45, and the attachment strength between the substrate and inductor 10 can be secured. Further, interference between the side faces 40a-40d and the substrate attachment portion 33 can be blocked.

According to this embodiment, the terminals 32 on adjoining sides of the two flat wires 30 are connected through a wiring pattern of a substrate in which the inductor is mounted. With the structure, the area of the mounting positions of the flat wires 30 to the substrate can be increased (from two to four) corresponding to the number of the flat wires 30, thereby intensifying the attachment strength at the attachment position. As a consequence, reliability of the inductor 10 can be improved. The winding structure 31 composed of the two flat wires 30 can be regarded as the inductor 10 composed of a single flat wire 30. Thus, the structure can be regarded as a structure in which its number of coils is a sum of the numbers of coils in the two winding structure 31.

Second Embodiment

Hereinafter, the second embodiment of the present invention will be described with reference to FIGS. 11-13. In the inductor 11 of the present embodiment, its basic structure is the same as that of the first embodiment. Thus, description of the same portions as described in the first embodiment will not be described and like reference numerals are attached to those portions.

Figure 11:
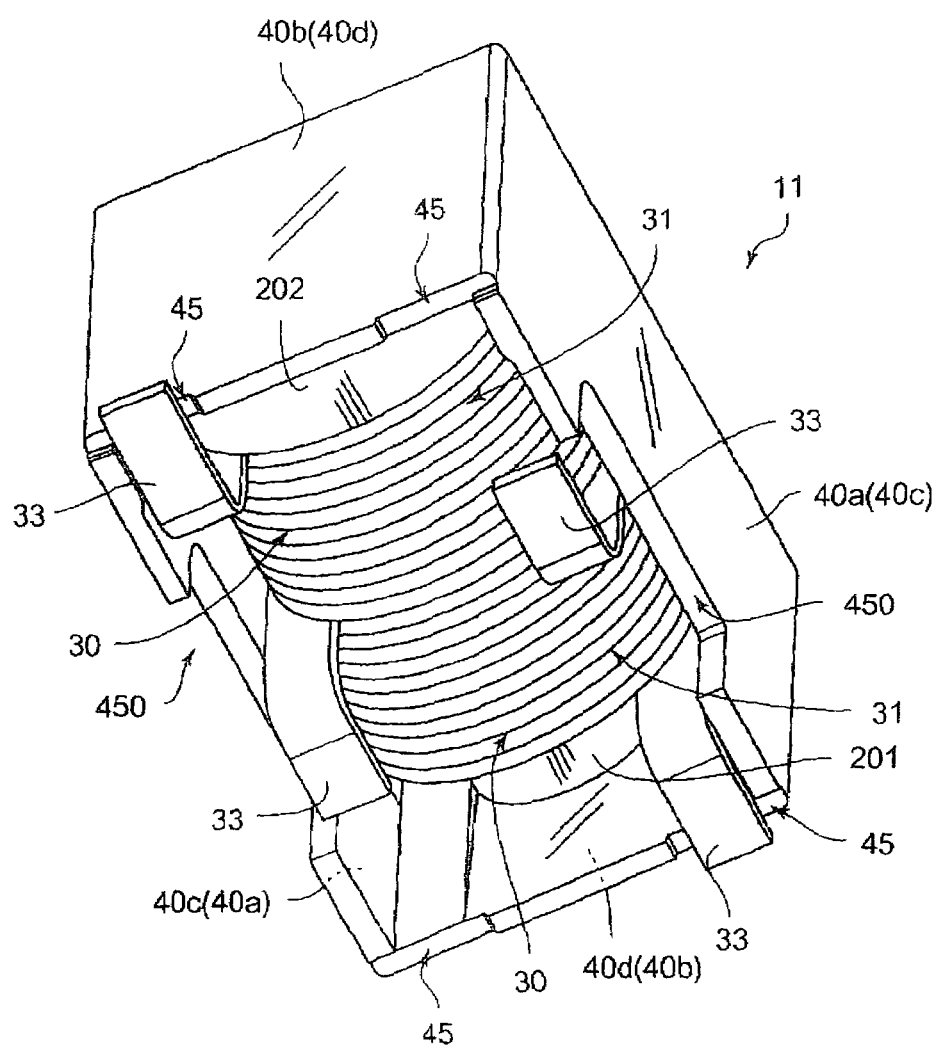
FIG. 11 is a perspective view showing the appearance of the inductor according to a second embodiment of the present invention.

FIG. 11 is a perspective view showing the entire structure of the inductor 11 according to the second embodiment of the present invention. FIG. 12 is a side view of the inductor 11, and FIG. 13 is a bottom view thereof.

Figure 12:
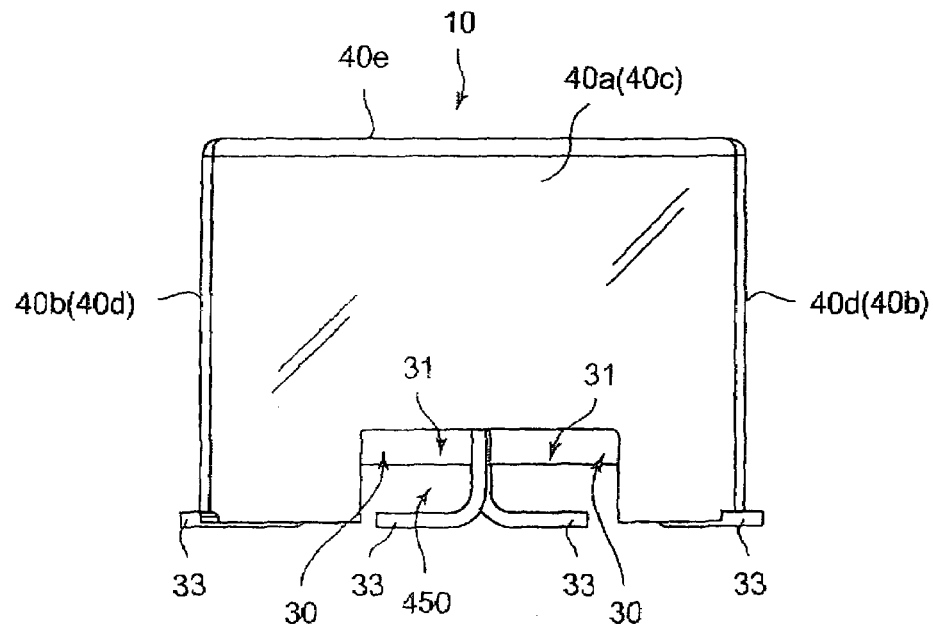
FIG. 12 is a side view of the inductor of FIG. 11 as seen from the side thereof.
Figure 13:
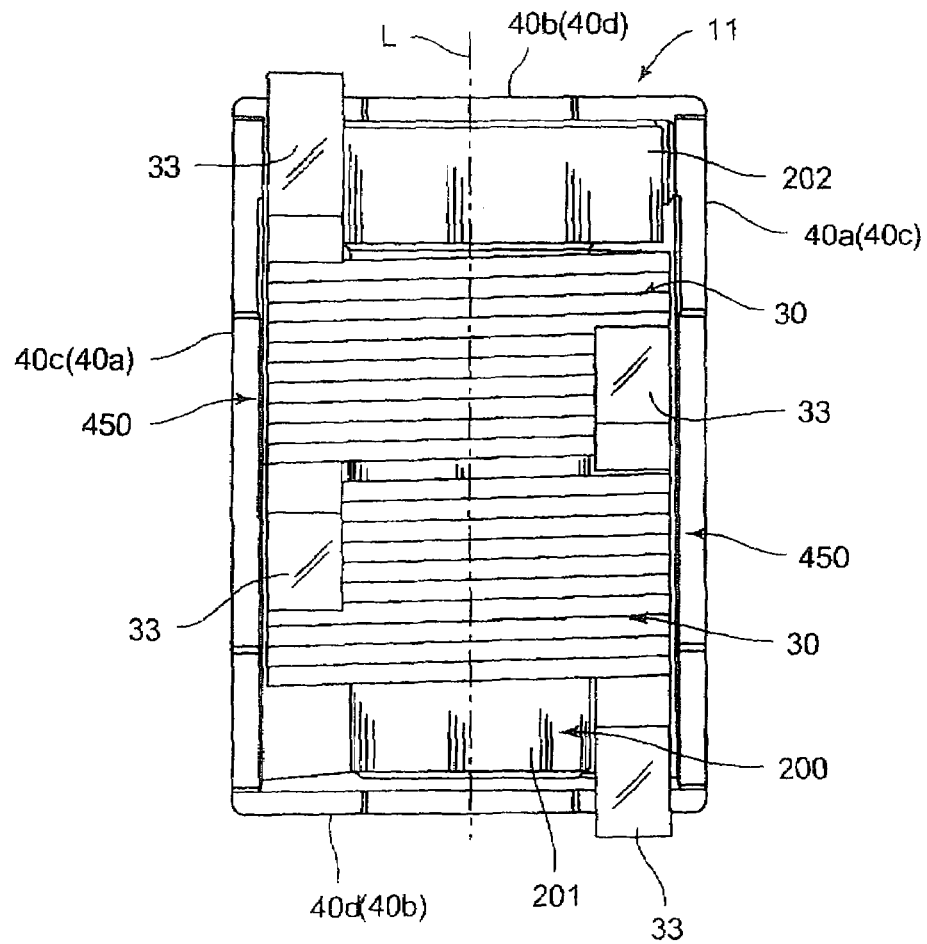
FIG. 13 is a bottom view of the inductor of FIG. 11 as seen from the side of the opening portion.
Figure 14:
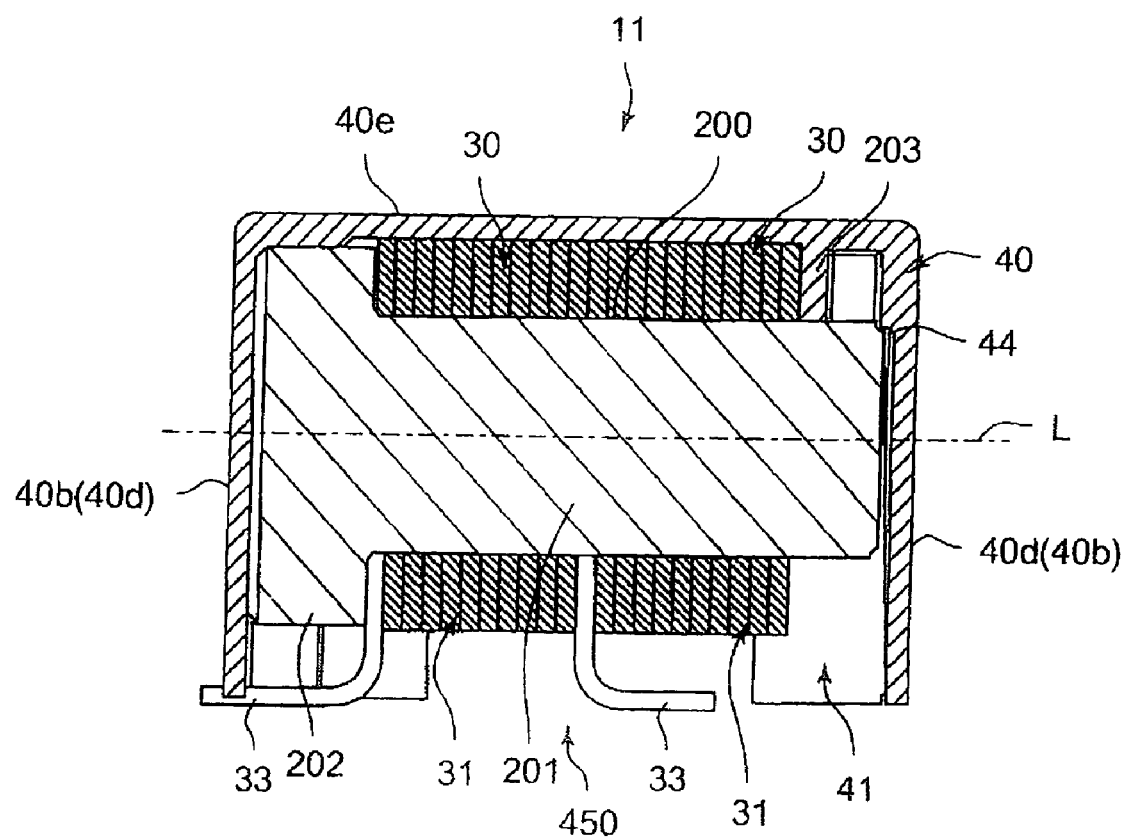
FIG. 14 is a side sectional view of FIG. 11 as seen from the side.

In the inductor 50 of the present embodiment, as shown in FIGS. 11 and 12, the case body 40 has no slit 46 different from the inductor 10 of the first embodiment. Thus, the terminal 32 has no expanded portion 34 capable of being inserting into the slit 46. That is, the terminal 32 is not subjected to bending in the diameter expanding direction and consequently, no expanded portion 34 exists.

The shape of part of the bottom end concave portions existing in the case body 40 is different in the present embodiment. That is, according to the present embodiment, the bottom end concave portion (hereinafter, the bottom end portions existing in the side faces 40a and 40c of this embodiment are called bottom end concave portion 450) existing in the side faces 40a and 40c are largely open. "Largely open" mentioned here means that the size (cutout dimension) of the bottom end concave portion 450 which is dented upward from the bottom end side of the inductor 11 is sufficiently larger than the cutout dimension of the bottom end concave portion 45 existing in the side faces 40b and 40d.

According to the present embodiment, the bottom end concave portion 450 is provided such that it is dented (cut out) enough for the winding structure 31 to be seen sufficiently when the inductor 11 is seen form sideway. However, the cut-out dimension of the bottom end concave portion 450 is not restricted to this example, but it may be cut out to such an extent that the winding structure 31 is not seen when the inductor 11 is seen from sideway. Further, the length of the bottom end concave portion 450 along the axial line L only needs to correspond to the length of the substrate attachment portion 33.

According to this embodiment, the bottom end concave portions 45 existing in the side faces 40b and 40d are disposed on the side of the corner of the case body 40. However, the dent dimension of the bottom end concave portion 45 is the same as the first embodiment.

According to the present embodiment, a core 200 having a substantially T-shaped appearance is used different from the core 20 of the first embodiment. The core 200 is comprised of a cylindrical portion 201 and a jaw portion 202. The cylindrical portion 201 has the same diameter as the core 20 of the first embodiment. A portion (end portion) on an opposite side to the side in which the jaw portion 202 exists of the cylindrical portion 201 is received by a core receiving portion 44 which is equal to the first embodiment. The jaw portion 202 is a disc-like member having a diameter corresponding to the width of the concave portion 41 although it is slightly smaller than the width of the concave portion 41. The diameter of the jaw portion 202 is set sufficiently larger than the diameter of the cylindrical portion 201.

An insulating portion such as insulation tape may be provided on a portion making contact with the flat wire 30 of the core 200. As a result, insulation can be achieved between the core 200 and the flat wire 30. According to the present embodiment, a spacer 203 can be provided for supporting a portion apart from the jaw portion 202 within the concave portion 41 of the cylindrical portion 201 of the core 200. When the spacer 203 makes contact with the concave portion 41, the core 200 is kept substantially parallel to the axial line L within the concave portion 41.

In the present embodiment, the numbers of windings in the winding structures 31 of the two flat wires 30 are substantially the same. No flat wire 30 is wound around the jaw portion 202. Thus, a portion around which no flat wire 30 is wound exists by a predetermined length on a portion opposite to (front end portion of the jaw portion 202) the side in which the jaw portion 202 is provided. However, the winding structure 31 on the side in which no jaw portion 202 exists may contain a larger number of windings of the flat wires 30.

In the inductor 11 having such a structure, the two winding structures 31 are overlapped along the axial line L like the inductor 10 of the first embodiment. Consequently, the number of the flat wires 30 can be increased, so that the number of the terminals 32 is increased and the area of the attachment portions to the substrate can be increased. Thus, attachment of the inductor 11 to the substrate can be intensified.

Therefore, reliability of respective devices each using the inductor 11 can be maintained for a long period by intensifying the attachment strength of the inductor 11 like the inductor 10 of the first embodiment.

The present embodiment includes the bottom end concave portion 450 having a large cutout dimension. Thus, when soldering is executed, its attachment condition can be confirmed. Consequently, soldering fault can be prevented so as to intensify the soldering strength of the inductor 11 to the substrate. Because the core 200 has the jaw portion 202, the jaw portion 202 can be made to function for positioning when the flat wire 30 is wound around the core 200.

The first embodiment and the second embodiment of the present invention have been described above and additionally, the present invention may be modified in various ways, for example as described below.

In each of the above-described embodiments, the inductors 10 and 11 are attached to the mounting position of the substrate through the substrate attachment portion 33. However, a portion to be attached to the substrate is not limited to the substrate attachment portion 33 formed by bending the terminal 32 but after the terminal 32 is inserted into the substrate, it may be fixed by soldering or the like at its insertion position. Further, another terminal member may be attached to the case body 40.

In each of the above-described embodiments, the inductors 10 and 11 include the case body 40. However, the inductor 10 is not limited to a structure including the case body 40 but may be of a type not including the case body 40. In this case, the inductor 10 comes to have a structure including the core 20, 200 and the flat wire 30. Further, any core member may be used as long as it allows the flat wire 30 to be wound around and positioned, for example, it is permissible to use a hollow cylindrical member composed of magnetic or nonmagnetic material.

A case where the two flat wires 30 are used has been described in each of the above embodiments. However, the number of the flat wires 30 is not limited to two, but three or more flat wires may be used. If three or more flat wires 30 are used, a flat wire 30 is sandwiched by flat wires existing on both sides thereof and the expanded portion 34 is provided on each of both terminals 32 of such sandwiched flat wire 30.

In each of the above embodiments, the two flat wires 30 are connected to each other through the substrate. However, the flat wires 30 are not always confined to a structure in which they are connected to each other through the substrate, but may adopt a structure which allows each of the flat wires 30 to be supplied with current independently.

The first embodiment adopts a structure in which the expanded portion 34 is located substantially in the center of the axial line L of the inductor 10. However, it may adopt a structure in which the expanded portion 34 is located on the side of the end portion of the axial line L. In this case, the slit 46 may not be provided.

Further, the first embodiment adopts a structure in which the positioning concave portion 43, the bottom end concave portion 45 and the slit 46 are provided on the case body 40. However, a structure in which these are not provided may be adopted.

Further, the above-described structure may be adopted in another electronic member such as transformer and filter.

INDUSTRIAL APPLICABILITY

The inductor of the present invention can be used in fields of electric appliances.

The invention claimed is:

1. An inductor comprising:
   a core member composed of magnetic material;
   a case body having a concave portion in which the winding structure and the core member are located by built-in while the axial line of the core member opposes the bottom face of the concave portion,
   a flat wire wound around the core member by plural turns by edgewise winding for forming a winding structure; and a plural of the winding structures are overlapped along the axial direction of the core member;
   wherein a bottom end concave portion is formed at the edge portion adjoining the opening portion in the side face of the case body, and
   a substrate attachment portion constituted by bending the terminal of the flat wire is located in the bottom end concave portion.

2. The inductor according to claim 1, wherein
   the case body includes slits each directed from the side of an opening portion constituting the case body to a side departing from the opening portion side, and
   at least one of the terminals of the flat wires is provided with an expanded portion which is expanded outward of the winding by expanding the diameter while the expanded portions are inserted into the slits.

3. The inductor according to claim 2 wherein the expanded portion exists on only a side of the terminal adjoining the other flat wire.

4. The inductor according to claim 3 wherein two flat wires are provided.

5. The inductor according to claim 1 wherein the terminals existing on sides adjoining the other flat wire of the plural flat wires are connected to each other through a mounted substrate.

6. The inductor according to claim 2 wherein
   the case body is provided with a bottom end concave portion which is dented from the edge portion of the opening portion in the side face, and
   a substrate attachment portion constituted by bending the terminal of the flat wire is located in the bottom end concave portion.

7. The inductor according to claim 3 wherein
   the case body is provided with a bottom end concave portion which is dented from the edge portion of the opening portion in the side face, and
   a substrate attachment portion constituted by bending the terminal of the flat wire is located in the bottom end concave portion.

8. The inductor according to claim 4 wherein
   the case body is provided with a bottom end concave portion which is dented from the edge portion of the opening portion in the side face, and
   a substrate attachment portion constituted by bending the terminal of the flat wire is located in the bottom end concave portion.

9. The inductor according to claim 2 wherein the terminals existing on sides adjoining the other flat wire of the plural flat wires are connected to each other through a mounted substrate.

10. The inductor according to claim 3 wherein the terminals existing on sides adjoining the other flat wire of the plural flat wires are connected to each other through a mounted substrate.

11. The inductor according to claim 4 wherein the terminals existing on sides adjoining the other flat wire of the plural flat wires are connected to each other through a mounted substrate.

12. The inductor according to claim 6 wherein the terminals existing on sides adjoining the other flat wire of the plural flat wires are connected to each other through a mounted substrate.

13. The inductor according to claim 7 wherein the terminals existing on sides adjoining the other flat wire of the plural flat wires are connected to each other through a mounted substrate.

14. The inductor according to claim 8 wherein the terminals existing on sides adjoining the other flat wire of the plural flat wires are connected to each other through a mounted substrate.

* * * * *